United States Patent
Yun

(10) Patent No.: US 8,767,479 B2
(45) Date of Patent: Jul. 1, 2014

(54) SEMICONDUCTOR MEMORY DEVICE AND DRIVING METHOD THEREOF

(75) Inventor: Jae-Woong Yun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 164 days.

(21) Appl. No.: 13/339,852

(22) Filed: Dec. 29, 2011

(65) Prior Publication Data

US 2013/0107643 A1    May 2, 2013

(30) Foreign Application Priority Data

Oct. 27, 2011   (KR) .................. 10-2011-0110501

(51) Int. Cl.
*G11C 7/00*  (2006.01)
*G11C 7/10*  (2006.01)
*G11C 8/00*  (2006.01)

(52) U.S. Cl.
USPC ............ 365/189.05; 365/189.11; 365/189.17; 365/230.03; 365/230.06

(58) Field of Classification Search
USPC ............ 365/189.05, 189.11, 189.17, 230.03, 365/230.06
See application file for complete search history.

(56) References Cited

U.S. PATENT DOCUMENTS

| | | | | |
|---|---|---|---|---|
| 5,943,252 | A * | 8/1999 | Schultz et al. ........... | 365/189.05 |
| 7,151,703 | B2 * | 12/2006 | Lee et al. ................. | 365/189.11 |
| 7,663,940 | B2 * | 2/2010 | Kim .......................... | 365/189.11 |
| 8,193,829 | B2 * | 6/2012 | Song ........................ | 365/230.06 |
| 8,385,137 | B2 * | 2/2013 | Song ........................ | 365/189.11 |

* cited by examiner

*Primary Examiner* — Trong Phan
(74) *Attorney, Agent, or Firm* — IP & T Group LLP

(57) ABSTRACT

A semiconductor memory device using a termination scheme in a global data line includes a global data line and a data line drive unit. The global data line transfers data between an interface region and a plurality of core regions each having a memory bank. The data line drive unit is disposed in each of the core regions, and drives the data global line in response to data in a data transfer operation. The data line drive unit sets the global data line to a termination voltage level in a termination operation.

12 Claims, 5 Drawing Sheets

SEMICONDUCTOR MEMORY DEVICE AND DRIVING METHOD THEREOF

CROSS-REFERENCE TO RELATED APPLICATIONS

The present application claims priority of Korean Patent Application No. 10-2011-0110501, filed on Oct. 27, 2011, which is incorporated herein by reference in its entirety.

BACKGROUND

1. Field

Exemplary embodiments of the present invention relate to a semiconductor design technology, and more particularly, to a semiconductor memory device using a termination scheme in a global data line.

2. Description of the Related Art

In general, a plurality of data lines for transferring data are disposed in a semiconductor memory device such as a double data rate synchronous DRAM (DDR SDRAM). As the capacity of the semiconductor memory device is increased, the length of the data lines is also increased. Here, the increase in the length of the data lines may cause the increase in loads of the data lines for transferring data.

Meanwhile, the data lines used in the semiconductor memory device may be divided into a segment input/output line, a local input/output line, a global input/output line, etc. depending on where they are disposed. Particularly, since a global data line such as a global input/output line has relatively large loads, distortion and loss of data may occur. Therefore, the repeater scheme in which two inverter stages are disposed in the middle of the global data line has been used to reduce distortion of data.

However, the repeater scheme is merely a driver circuit with an exemplary structure and has considerably large power consumption. Accordingly, a termination scheme of the global data line is being proposed.

FIG. 1 illustrates a conventional termination circuit.

Referring to FIG. 1, a semiconductor memory device includes a plurality of core regions 110, a termination unit 120, and a latching unit 130.

Each of the plurality of core regions 110 is a region including a memory bank, and the semiconductor memory device performs a read operation and a write operation using the memory bank. That is, in the write operation of the semiconductor memory device, data inputted through a data pad 140 (disposed in an interface region) is transferred through a global data line GIO, and the transferred data is stored in the memory bank disposed in the core region 110. In the read operation of the semiconductor memory device, the data stored in the memory bank is transferred through the global data line GIO, and the transferred data is outputted to the outside of the semiconductor memory device through the data pad 140.

The termination unit 120 is used to perform a termination operation of the global data line GIO. The termination unit 120 drives the global data line GIO to have a termination level (VDD/2) in response to a termination control signal TM_CTR. In this case, the termination control signal TM_CTR is a signal activated during read and write operation periods of data, and it may correspond to a column command signal activated in the read and write operations. The termination unit 120 is disposed between a ground voltage VSS terminal and a power supply voltage VDD terminal.

Subsequently, the latching unit 130 is a component for preventing the global data line GIO from being floated.

Hereinafter, the conventional termination operation will be briefly described.

When the termination operation is performed, i.e., when the termination control signal TM_CTR is activated as a logic 'high,' both PMOS and NMOS transistors in the termination unit 120 are turned on. Thus, the voltage level of the global data line GIO is terminated at the termination level (VDD/2).

As described above, the termination control signal TM_CTR is a signal activated during the read and write operation periods of data in the semiconductor memory device, and a direct current path including the PMOS and NMOS transistors is formed in the termination operation. That is, in the conventional semiconductor memory device, the direct current path is formed in the termination operation, and a large amount of current is consumed through the direct current path.

Meanwhile, as the storage capacity of the semiconductor memory device becomes larger, the length of a data line becomes longer, and the length of the global data line GIO also becomes longer. In order to perform a termination operation of the global data line GIO which is longer as described above, the circuit size of the termination unit 120 increases.

SUMMARY

An embodiment of the present invention is directed to a semiconductor memory device for performing a termination operation without increasing the size of a termination circuit.

In accordance with an embodiment of the present invention, a semiconductor memory device includes a global data line configured to transfer data between an interface region and a plurality of core regions each having a memory bank; and a data line drive unit disposed in each of the core regions and configured to drive the data global line in response to the data in a data transfer operation and set the global data line to a termination voltage level in a termination operation.

In accordance with another embodiment of the present invention, an integrated circuit includes a pull-up drive control unit configured to drive a global data line with a pull-up voltage depending on data in response to a pull-up termination control signal; and a pull-down drive control unit configured to drive the global data line with a pull-down voltage depending on the data in response to a pull-down termination control signal, wherein the pull-up and pull-down termination control signals are activated during different periods before a column command signal is activated.

In accordance with still another embodiment of the present invention, a termination operating method includes performing a termination operation of a global data line during a set period before a column command signal is activated; and driving the global data line depending on data after the column command signal is activated.

In the semiconductor memory device in accordance with the embodiments of the present invention, 'tAA' that is a time variable of the semiconductor memory device may be reduced without using an additional termination circuit.

DETAILED DESCRIPTION

Figure 1:
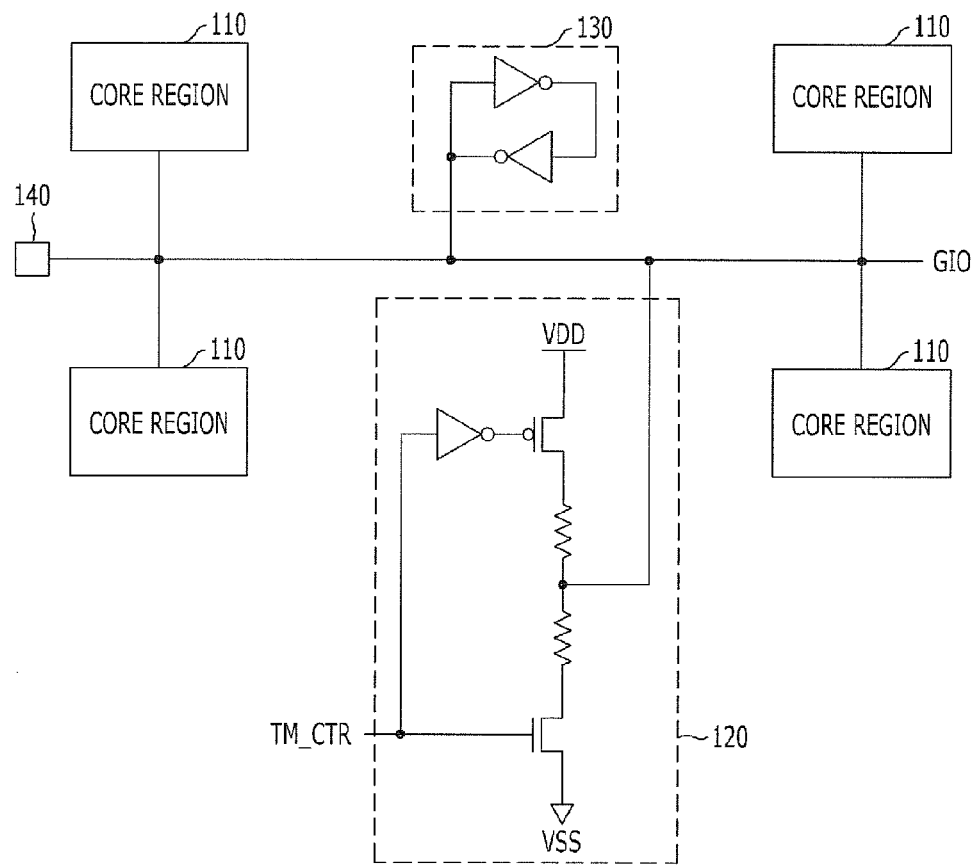
FIG. 1 illustrates a conventional termination circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
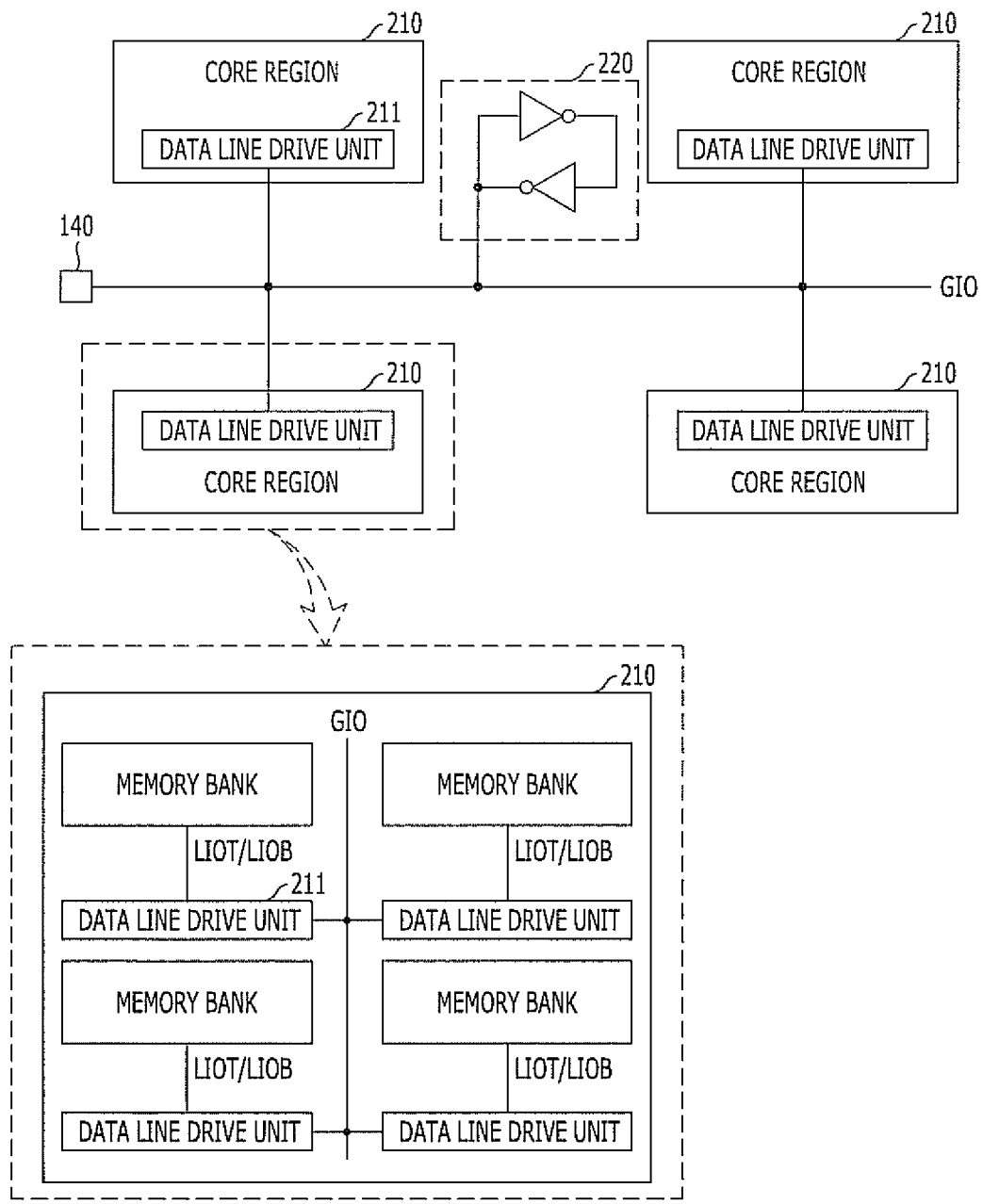
FIG. 2 illustrates a semiconductor memory device in accordance with an exemplary embodiment of the present invention.

FIG. 2 illustrates a semiconductor memory device in accordance with an exemplary embodiment of the present invention.

Referring to FIG. 2, the semiconductor memory device in accordance with the embodiment of the present invention includes a plurality of core regions 210 and a latching unit 220. Here, the latching unit 220 is a component for preventing a global data line GIO from being floated.

The semiconductor memory device in accordance with the exemplary embodiment of the present invention has a data line drive unit 211 disposed in each of the plurality of core regions 210. The data line drive unit 211 may drive the global data line GIO in response to data in a data transfer operation, and it terminates the global data line GIO, that is, to set at a termination voltage level, in a termination operation. In FIG. 2, the data line drive unit 211 is disposed in each of the core regions 210, i.e., corresponding to each memory bank. In this case, the termination operation may be performed correspondingly to each memory bank. In a data transfer operation, the core region 110 transmits data stored in a memory bank to the local input/output line pair LIO/LIOB through the data line drive unit 211.

Figure 3:
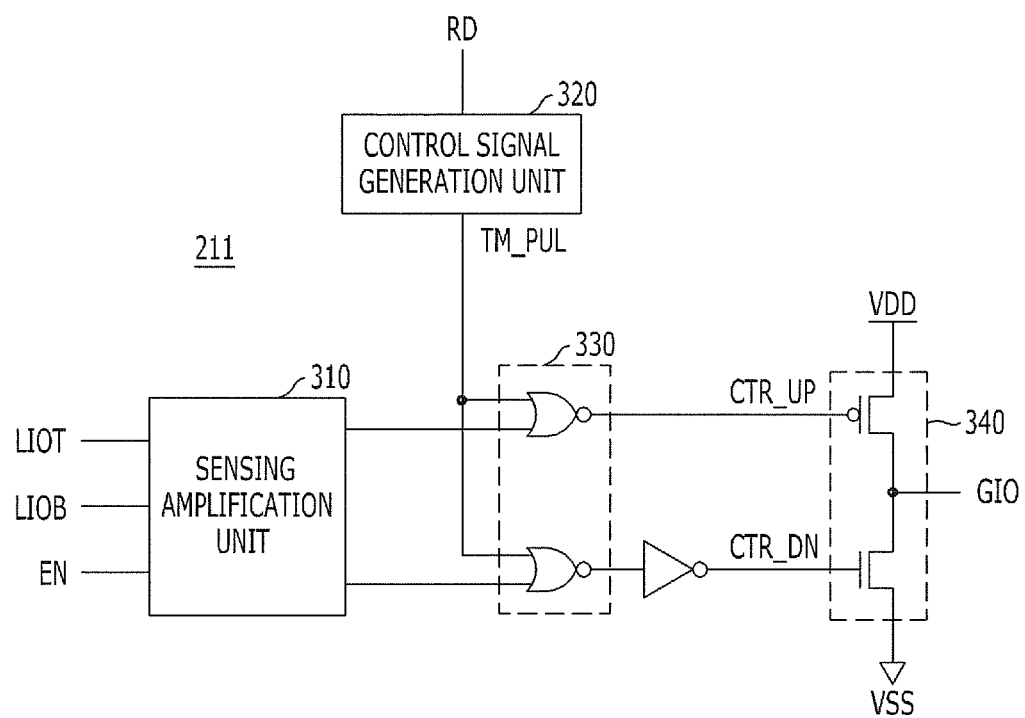
FIG. 3 illustrates an exemplary embodiment of a data line drive unit of FIG. 2.

FIG. 3 illustrates an embodiment of the data line drive unit 211 of FIG. 2.

Referring to FIG. 3, the data line drive unit 211 includes a sensing amplification unit 310, a control signal generation unit 320, a selective transfer unit 330 and a line drive unit 340.

The sensing amplification unit 310 senses data transferred through local input/output line pair LIOT and LIOB, amplifies the sensed data, and then outputs the amplified data. Here, the sensing amplification unit 310 performs a sensing amplification operation in response to an enable signal EN, and the enable signal EN is a signal activated in a read operation. For reference, in the semiconductor memory device, a column command signal for the read operation is activated in the read operation. The enable signal EN may be a signal corresponding to the column command signal. For reference, in the semiconductor memory device, a column command signal for a write operation is activated in the write operation.

The control signal generation unit 320 generates a termination control signal TM_PUL in response to a signal RD for the read operation. Here, the termination control signal TM_PUL is a pulse signal activated during a certain period before the column command signal for the read operation is activated in response to the signal RD for the read operation.

The selective transfer unit 330 selectively outputs data outputted from the sensing amplification unit 310 as driving control signals CTR_UP and CTR_DN in response to the termination control signal TM_PUL. That is, when the termination control signal TM_PUL is deactivated as a logic 'low,' the selective transfer unit 330 outputs an output signal LIOT or LIOB of the sensing amplification unit 310 so that a pull-up driving control signal CTR_UP or a pull-down driving control signal CTR_DN is activated. When the termination control signal TM_PUL is activated as a logic 'high,' the selective transfer unit 330 outputs the termination control signal TM_PUL so that both the pull-up driving control signal CTR_UP and the pull-down driving control signal CTR_DN are activated as a logic "low".

The line drive unit 340 drives the global data line GIO in response to the pull-up driving control signal CTR_UP and the pull-down driving control signal CTR_DN, outputted from the selective transfer unit 330. As described above, in the data transfer operation, one of the pull-up driving control signal CTR_UP and the pull-down driving control signal CTR_DN is activated corresponding to the data. Hence, the global data line GIO is pull-up driven in response to the pull-up driving control signal CTR_UP or pull-down driven in response to the pull-down driving control signal CTR_DN. For example, the global data line GIO is supplied with a power supply voltage VDD in response to the pull-up driving control signal CTR_UP and a ground voltage VSS in response to the pull-down driving control signal CTR_DN. In the termination operation, the pull-up driving control signal CTR_UP is activated as the logic 'low,' and the pull-down driving control signal CTR_DN is activated as the logic 'high.' Hence, the global data line GIO are simultaneously pull-up driven and pull-down driven, i.e., terminated.

In other words, since the termination control signal TM_PUL is a pulse signal activated during a certain period before a column command signal is activated, the termination operation of the global data line GIO is performed during the period before data is transferred, i.e., when the termination control signal TM_PUL is activated, and the data transfer operation is then performed. Accordingly, in the termination operation, the line drive unit 340 terminates the global data line GIO in response to the termination control signal TM_PUL. Then, in the data transfer operation, the line drive unit 340 drives the global data line GIO in response to the data outputted from the sensing amplification unit 310.

Figure 4:
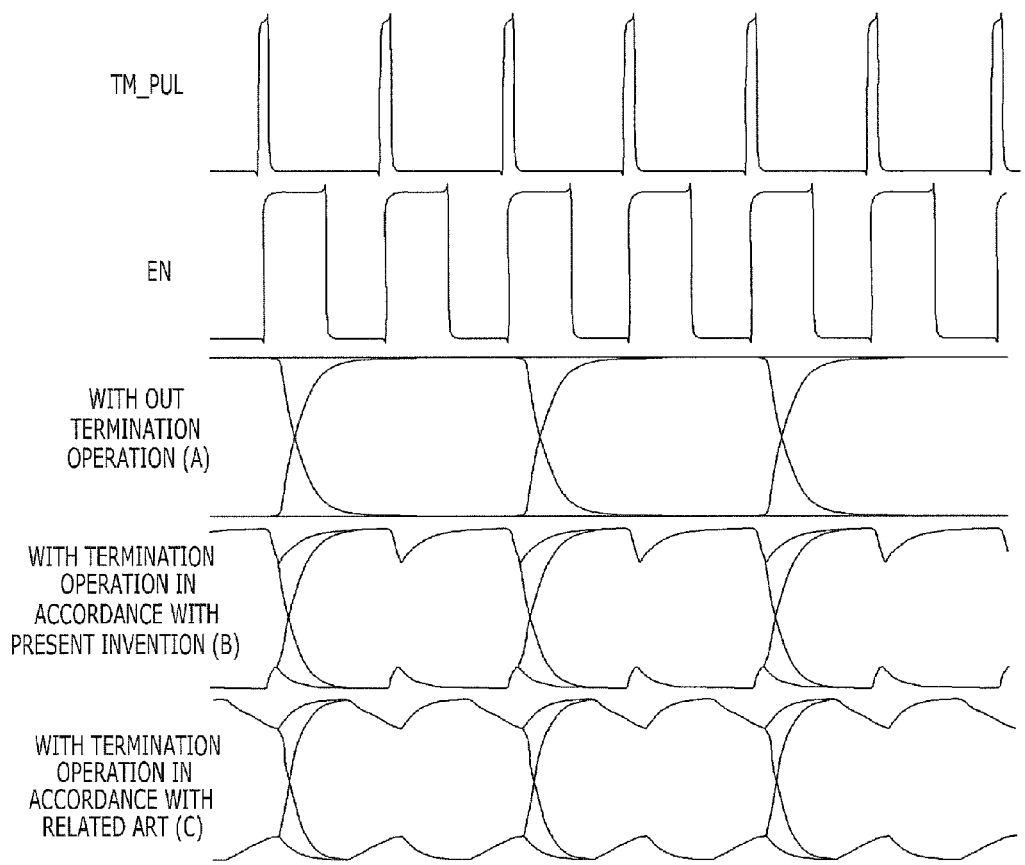
FIG. 4 is a waveform diagram illustrating a termination operation in accordance with an exemplary embodiment of the present invention, in which a reading operation of the semiconductor memory device is illustrated as an example.

FIG. 4 is a waveform diagram illustrating a termination operation in accordance with the embodiment of the present invention, in which a reading operation of the semiconductor memory device is illustrated as an example.

FIG. 4 illustrates waveform diagrams of reading operations without the termination operation (A), with the termination operation (B) in accordance with the present invention, and with the termination operation (C) in accordance with the related art. The termination operation (B) in accordance with the present invention may secure an effective data period wider than the termination operation (C) in accordance with the related art.

In the termination operation (C) in accordance with the related art, the termination operation is performed during all periods of the read operation, and hence a large amount of current is consumed. However, the termination operation in accordance with the embodiment of the present invention is activated during a certain period before the data transfer operation is performed, and hence current consumption may be reduced in the other period. That is, the circuit configuration in accordance with the embodiment of the present invention has less current consumption than that in accordance with the related art.

Figure 5:
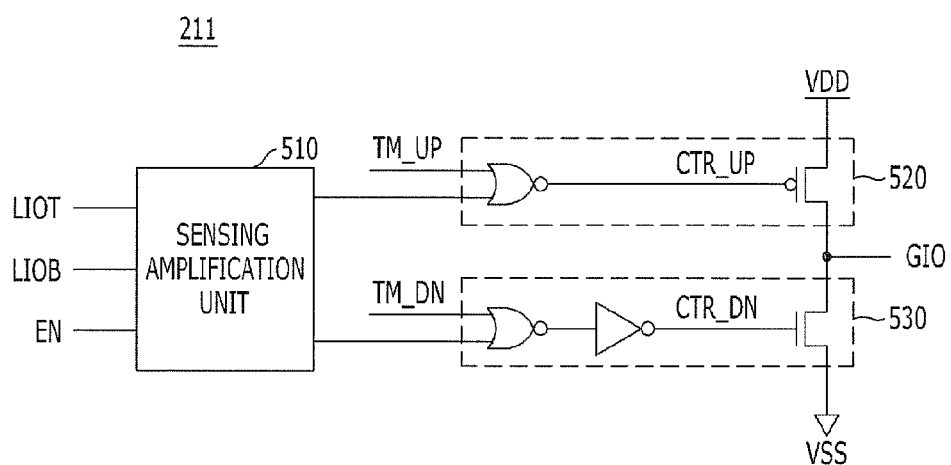
FIG. 5 illustrates another embodiment of the data line drive unit of FIG. 2.

FIG. 5 illustrates another embodiment of the data line drive unit 211 of FIG. 2.

Referring to FIG. 5, the data line drive unit 211 includes a sensing amplification unit 510, a pull-up drive control unit 520, and a pull-down drive control unit 530.

The sensing amplification unit 510 senses data transferred through local input/output line pair LIOT and LIOB, amplifies the sensed data, and then outputs the amplified data. The sensing amplification unit 510 may be configured the same as the sensing amplification unit 310 of FIG. 3, and therefore, its detailed description will be omitted.

The pull-up drive control unit 520 drives the global data line GIO in response to data outputted from the sensing amplification unit 510 or pull-up terminates the global data line GIO in response to a pull-up termination control signal TM_UP activated during a certain period before the column command signal is activated in the read operation. The pull-down drive control unit 530 drives the global data line GIO using the data outputted from the sensing amplification unit 510 or pull-down terminates the global data line GIO in response to a pull-down termination control signal TM_DN activated during a certain period before the column command signal is activated.

The activation times of the pull-up termination control signal TM_UP and the pull-down termination control signal TM_DN may be set different from each other. In addition, the activation times of the pull-up termination control signal TM_UP and the pull-down termination control signal TM_DN may be set so that one of the pull-up termination control signal TM_UP and the pull-down termination control signal TM_DN is activated depending on data skew situation or various environmental factors.

In accordance with the embodiments of the present invention, a termination operation is performed without using an additional termination circuit, so that a time variable 'tAA,' indicating a time taken to output data in response to a command in a read operation, may be reduced, thereby increasing a processing speed of the semiconductor memory device.

While the present invention has been described with respect to the specific embodiments, it will be apparent to those skilled in the art that various changes and modifications may be made without departing from the spirit and scope of the invention as defined in the following claims.

In addition, the positions and types of logic gates and transistors illustrated in the aforementioned embodiments will be differently implemented depending on the polarities of signals inputted thereto.

What is claimed is:

1. A semiconductor memory device, comprising:
a global data line configured to transfer data between an interface region and a plurality of core regions each having a memory bank; and
a data line drive unit disposed in each of the core regions and configured to drive the data global line in response to the data in a data transfer operation and set the global data line to a termination voltage level in a termination operation.

2. The semiconductor memory device of claim 1, further comprising a control signal generation unit configured to generate a termination control signal activated during a set period before a column command signal is activated.

3. The semiconductor memory device of claim 2, wherein the data line drive unit is configured to perform the termination operation in response to the termination control signal.

4. The semiconductor memory device of claim 2, wherein the data line drive unit comprises:
a selective transfer unit configured to output a pull-up driving control signal or a pull-down driving control signal which are selectively activated when the termination control signal is deactivated, output a pull-up driving control signal and a pull-down driving control signal which are activated when the termination control signal is activated; and
a line drive unit configured to drive the global data line in response to an output signal of the selective transfer unit.

5. The semiconductor memory device of claim 1, wherein the data line drive unit includes a plurality of data line drive units respectively corresponding to the memory banks of the plurality of core regions.

6. An integrated circuit comprising:
a pull-up drive control unit configured to drive a global data line with a pull-up voltage depending on data in response to a pull-up termination control signal; and
a pull-down drive control unit configured to drive the global data line with a pull-down voltage depending on the data in response to a pull-down termination control signal,
wherein the pull-up and pull-down termination control signals are activated during different periods before a column command signal is activated,
wherein each of the pull-up drive control unit and the pull-down drive control unit comprises:
a selective transfer unit configured to output a pull-up driving control signal or a pull-down driving control signal which are selectively activated when the termination control signal is deactivated, output a pull-up driving control signal and a pull-down driving control signal which are activated when the termination control signal is activated; and
a line drive unit configured to drive the global data line in response to an output signal of the selective transfer unit.

7. The integrated circuit of claim 6, wherein:
the pull-up drive control unit is configured to drive a global data line at a level of the pull-up voltage regardless of the data when the pull-up termination control signal is activated; and
the pull-down drive control unit is configured to drive the global data line at a level of the pull-down voltage regardless of the data when the pull-down termination control signal is activated.

8. The integrated circuit of claim 6, wherein one of the pull-up drive control unit and the pull-down drive control unit is activated in a termination operation.

9. A termination operating method, comprising:
performing a termination operation of a global data line during a set period before a column command signal is activated; and
driving the global data line depending on data after the column command signal is activated,
wherein the termination operation of the global data line and the driving the global data line depending on the data in a data transfer operation are performed in a data line drive unit disposed in each of the core regions.

10. The method of claim 9, wherein the performing of the termination operation comprises:
generating a termination control signal in response to the column command signal; and
driving the global data line with pull-up and pull-down voltages in response to the termination control signal.

11. The method of claim 10, wherein the driving of the global data line comprises:
driving the global data line with the pull-up voltage during a first period in the termination operation; and driving the global data line with the pull-down voltage during a second period different from the first period in the termination operation.

12. The method of claim 9, wherein the performing of the termination operation comprises:
   generating a termination control signal in response to the column command signal; and
   driving the global data line with one of pull-up and pull-down voltages in response to the termination control signal.

* * * * *